US007830352B2

(12) United States Patent
Shi et al.

(10) Patent No.: US 7,830,352 B2
(45) Date of Patent: Nov. 9, 2010

(54) DRIVING CIRCUIT FOR FLAT PANEL DISPLAY WHICH PROVIDES A HORIZONTAL START SIGNAL TO FIRST AND SECOND SHIFT REGISTER CELLS

(75) Inventors: Xuan-Fang Shi, Taichung (TW); Yu-Hsin Ting, Fongshan (TW); Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 1157 days.

(21) Appl. No.: 11/332,922

(22) Filed: Jan. 17, 2006

(65) Prior Publication Data

US 2006/0158409 A1 Jul. 20, 2006

(30) Foreign Application Priority Data

Mar. 31, 2005 (TW) .............................. 94110299 A

(51) Int. Cl.
*G09G 3/36* (2006.01)
*G11C 19/00* (2006.01)

(52) U.S. Cl. ........................................ 345/100; 377/64

(58) Field of Classification Search ................... 345/88, 345/98–100, 690, 204; 377/64–81
See application file for complete search history.

(56) References Cited

U.S. PATENT DOCUMENTS

| | | | | |
|---|---|---|---|---|
| 3,457,435 | A * | 7/1969 | Burns et al. | 327/437 |
| 5,629,744 | A * | 5/1997 | Kawamura | 348/792 |
| 5,712,653 | A * | 1/1998 | Katoh et al. | 345/100 |
| 5,781,171 | A * | 7/1998 | Kihara et al. | 345/93 |
| 5,892,493 | A | 4/1999 | Enami et al. | 345/94 |
| 5,894,296 | A * | 4/1999 | Maekawa | 345/98 |
| 6,046,711 | A * | 4/2000 | Kouchi | 345/8 |
| 6,256,005 | B1 * | 7/2001 | Kim | 345/88 |
| 6,731,266 | B1 | 5/2004 | Jung | 345/103 |
| 7,106,292 | B2 * | 9/2006 | Moon | 345/100 |
| 7,196,699 | B1 * | 3/2007 | Kubota et al. | 345/211 |
| 2004/0150610 | A1 * | 8/2004 | Zebedee et al. | 345/100 |
| 2004/0201563 | A1 * | 10/2004 | Kobayashi | 345/100 |

* cited by examiner

*Primary Examiner*—Alexander Eisen
*Assistant Examiner*—Liliana Cerullo
(74) *Attorney, Agent, or Firm*—Thomas, Kayden, Horstemeyer & Risley, LLP

(57) ABSTRACT

A driving circuit. The driving circuit includes a plurality of scan shift register cells, a pair of complementary clock signal lines, and a horizontal start signal generator. Each scan shift register cell comprises a bidirectional circuit, a shift register coupled to the bidirectional circuit, a transmission gate coupled to the shift register, and a data line coupled to the transmission gate. The complementary clock signal lines are coupled to the shift registers. The horizontal start signal generator provides a horizontal start signal to the bidirectional circuits in the first and a subsequent scan shift register cells. The shift register in each scan shift register cell provides an output signal to the bidirectional circuit in the next scan shift register cell. The bidirectional circuit in each scan shift register cell also receives the output signal from the shift register in the next scan shift register cell.

8 Claims, 10 Drawing Sheets

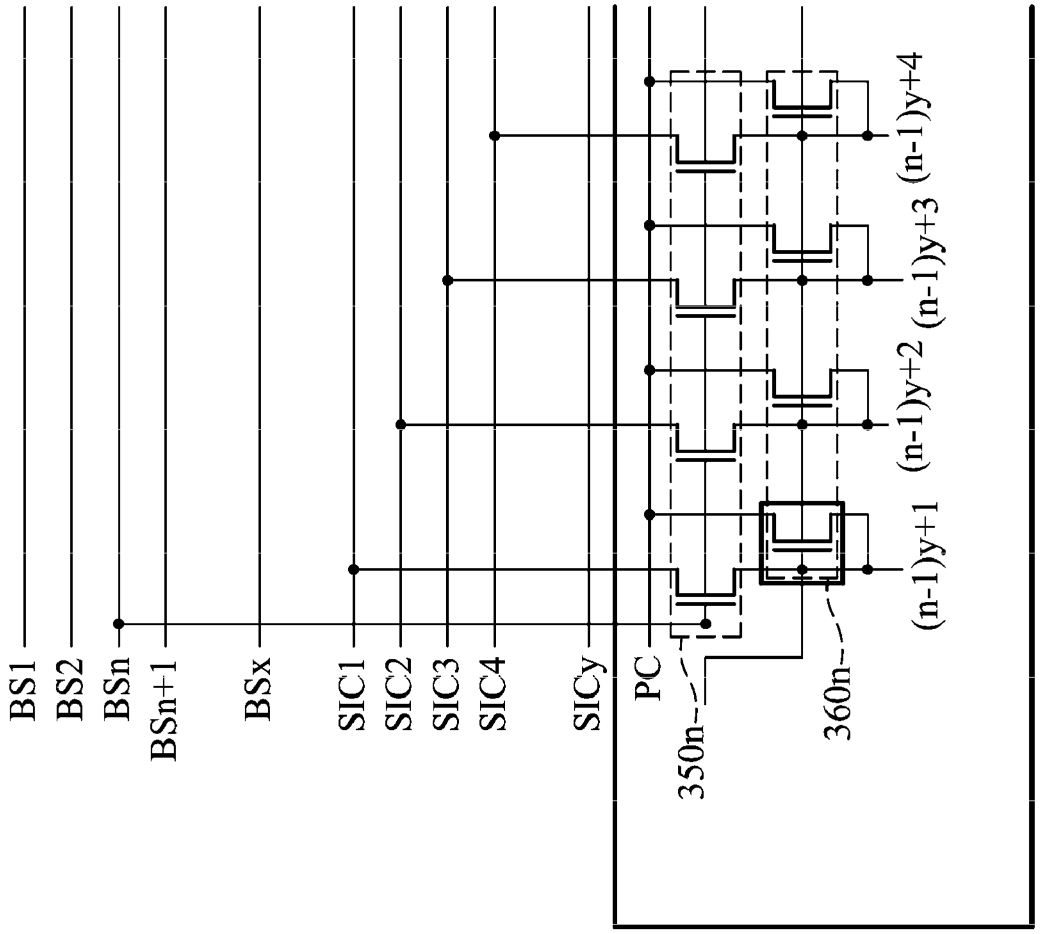
FIG. 2A ( PRIOR ART )

DRIVING CIRCUIT FOR FLAT PANEL DISPLAY WHICH PROVIDES A HORIZONTAL START SIGNAL TO FIRST AND SECOND SHIFT REGISTER CELLS

BACKGROUND

The invention relates to a driving circuit of a flat panel display and, in particular, to a driving circuit with a pre-charge function.

A conventional active pixel driving circuit comprises a gate line, a data line and a pixel array. Each pixel is controlled by a thin film transistor. A low temperature polysilicon process is employed to integrate vertical and horizontal scan shift registers on a glass substrate. A vertical scan shift register comprises a shift register and a gate line. A horizontal scan shift register comprises a shift register, a switch and a data line. A location of a pixel to be charged is determined by a combination of signals from both vertical and horizontal scan shift registers. When resolution of a display is increased, charge time of a pixel reduced and the pixel is not completely charged.

Some patents already provide solutions to the mentioned problems. FIGS. 1A to 1C and FIGS. 2A and 2B, respectively, show embodiments of U.S. Pat. Nos. 5,892,493 and 6,731,266. In those embodiments, an additional pre-charge circuit (marked by the square) is utilized to pre-charge a pixel before an actual signal reaches the pixel. When the actual signal reaches the pixel, it takes time to fully charge the pixel due to a small difference between the pre-charge voltage and the actual signal. However, the additional pre-charge circuit generally requires an additional pre-charge control signal and pre-charge voltage. As a result, more thin film transistors are required and the architecture is more complicated.

FIG. 3A shows a structure of a conventional horizontal scan shift register. The horizontal scan shift register comprises shift registers SR1 to SR3, a bidirectional circuit Bi-direc and a transmission gate TG. A start pulse signal HST is transmitted to a bidirectional circuit Bi-direc and the bidirectional circuit Bi-direc selects a direction to scan and provide input pulses to the shift registers SR1 to SR3. The shift registers SR1 to SR3 generate output pulses via shifting input pulses by a clock width. The output pulses HSR1 to HSR3 sequentially turn on switches such that data signals are stored into the pixels via RGB signal lines.

Since the conventional shift register cannot pre-charge, performance of a display cannot be improved. If a pre-charge function is needed, an additional circuit block for pre-charge is required, as shown in FIG. 3B.

SUMMARY

According to one aspect of the present invention, a driving circuit for a flat panel display comprises a plurality of scan shift register cells, a pair of complementary clock signal lines, and a horizontal start signal generator. Each scan shift register cell comprises a bidirectional circuit, a shift register, a transmission gate and a data line. The shift register is coupled to the bidirectional circuit. The transmission gate is coupled to the shift register and receives an RGB signal. The data line is coupled to the transmission gate. The complementary clock signal lines are respectively coupled to the shift registers in the scan shift register cells. The horizontal start signal generator provides a horizontal start signal to the bidirectional circuits in the first and another scan shift register cells. The shift register in each scan shift register cell provides an output signal to the bidirectional circuit in the next scan shift register cell. The bidirectional circuit in each scan shift register cell also receives the output signal from the shift register in the next scan shift register cell.

According to another aspect of the present invention, a method for driving a flat panel display comprises doubling a pulse width of an output pulse of a bidirectional circuit, and generating a double-pulse scan signal according to the output pulse of the bidirectional circuit.

A 3-input NAND gate is utilized to implement a bidirectional circuit. The bidirectional circuit is capable of receiving a single-width pulse and generating a double-width pulse having an pulse width twice that of the single-width pulse. The shift register in each scan shift register cell converts the double-width pulse into a double-pulse scan signal comprised of two pulses. The first pulse of the double-pulse scan signal enables pre-charge, and the second pulse of the double-pulse scan signal enables input of an actual pixel voltage. As such, the invention requires no additional pre-charge circuit block and driving signal lines. It is permissible to use only three additional thin film transistors to implement the invention.

BRIEF DESCRIPTION OF THE DRAWINGS

FIGS. 2A and 2B are schematic diagrams of embodiments of U.S. Pat. No. 6,731,266.

DETAILED DESCRIPTION

Figure 1A:
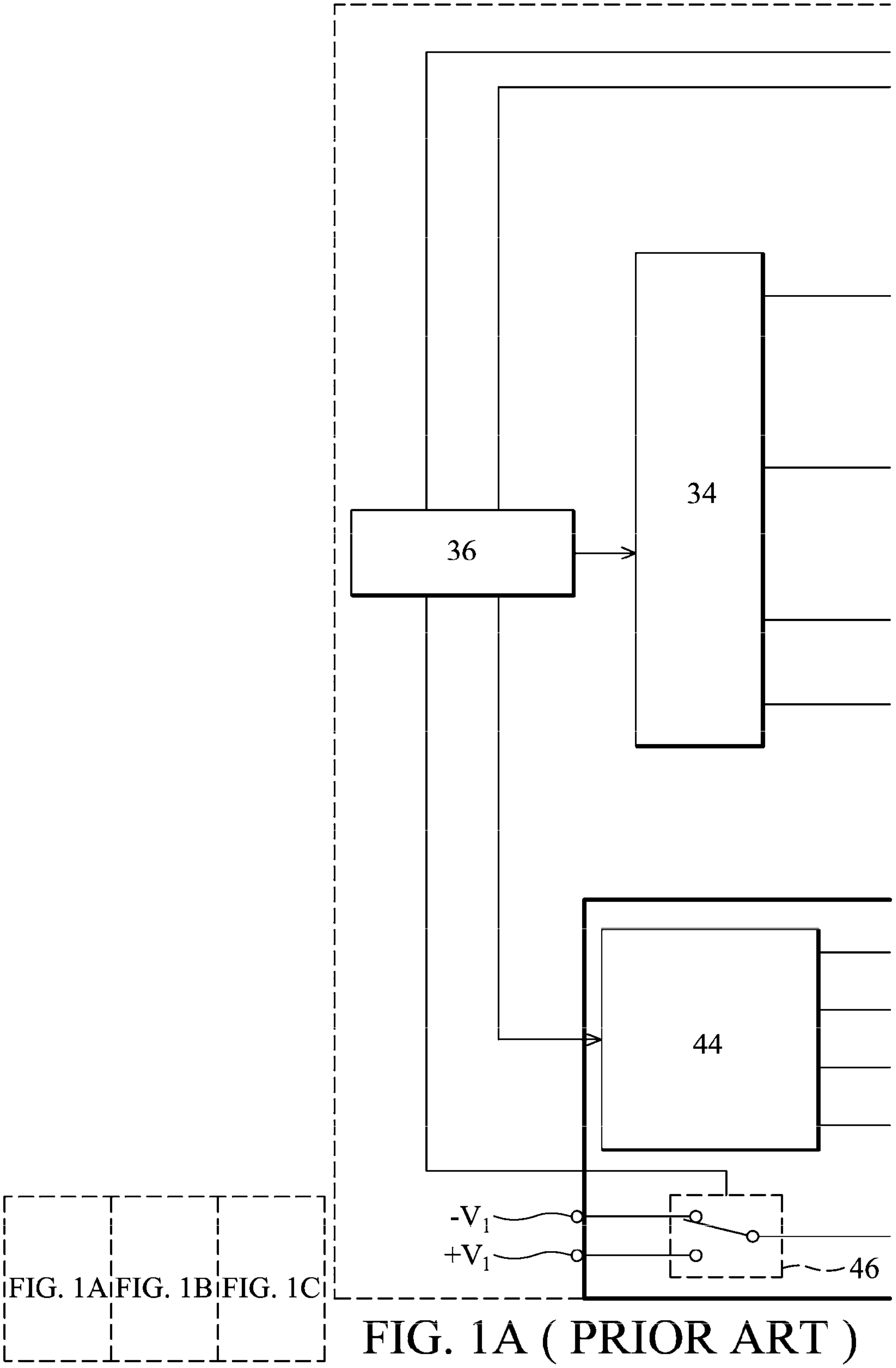
FIG. 1A ( PRIOR ART )
FIGS. 1A to 1C are schematic diagrams of embodiments of U.S. Pat. No. 5,892,493.
Figure 1B:
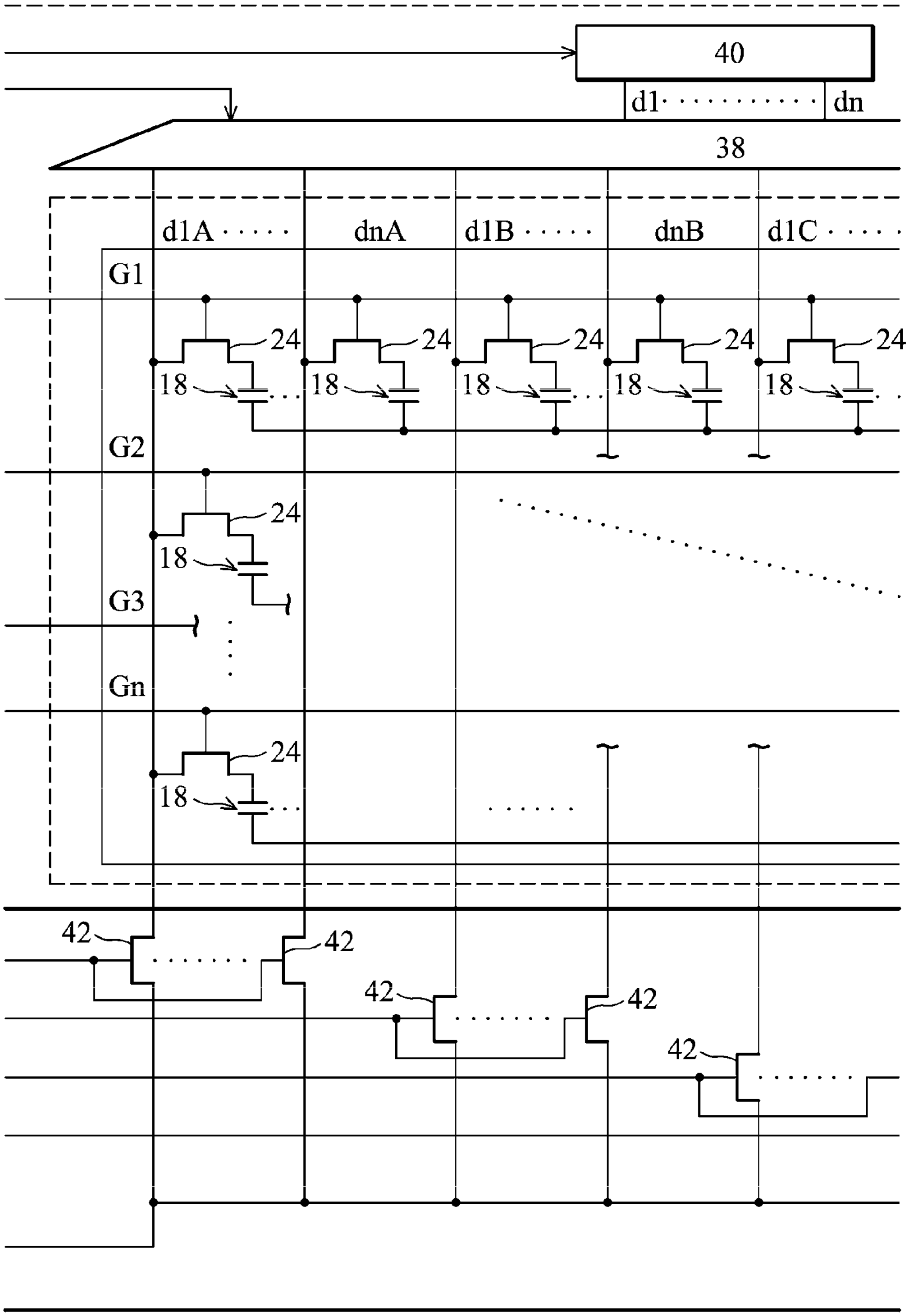
FIG. 1B ( PRIOR ART )
Figure 1C:
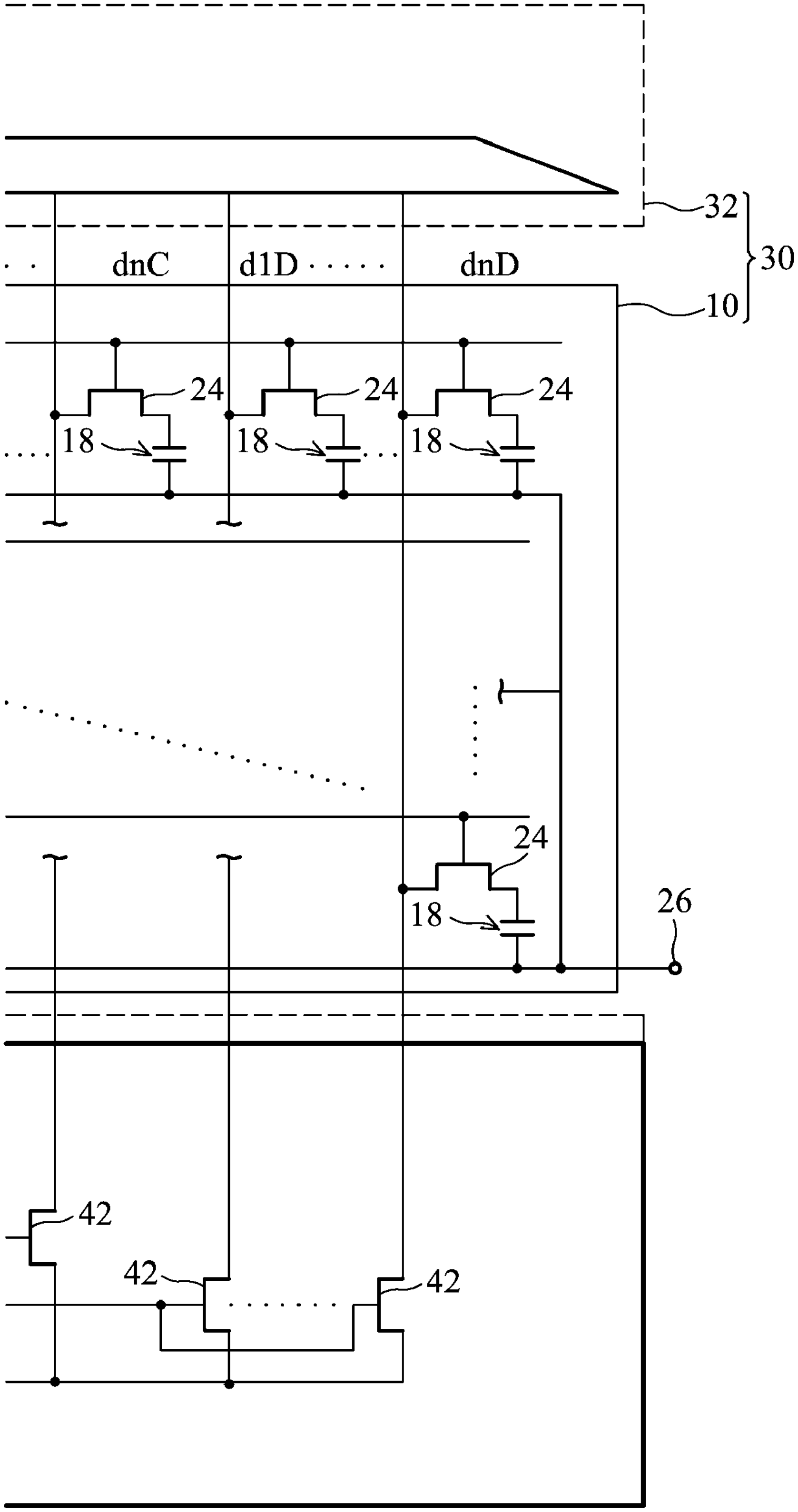
FIG. 1C ( PRIOR ART )
Figure 2B:
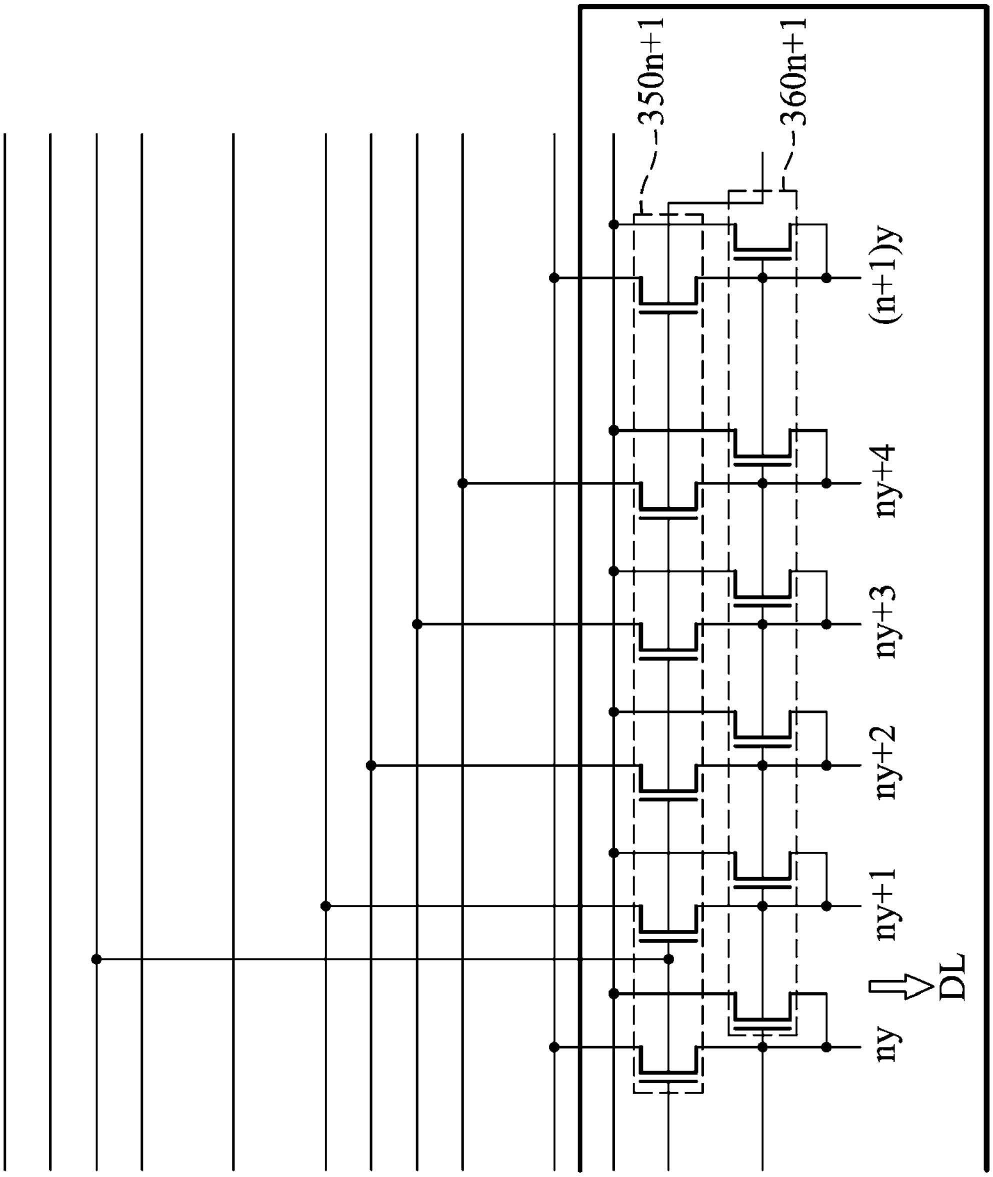
FIG. 2B ( PRIOR ART )
Figure 3A:
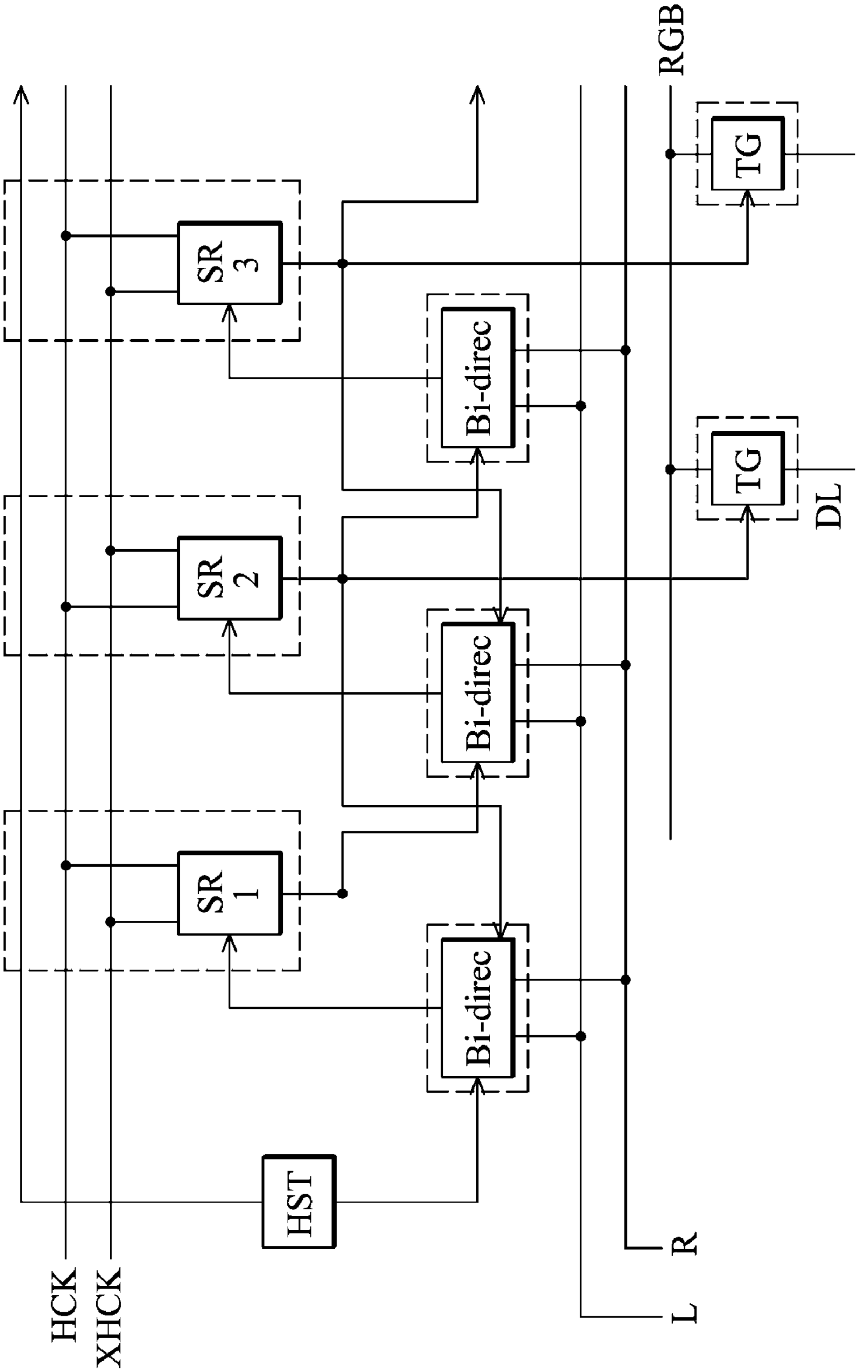
FIG. 3A ( PRIOR ART )
FIG. 3A shows a structure of a conventional horizontal scan shift register.
Figure 3B:
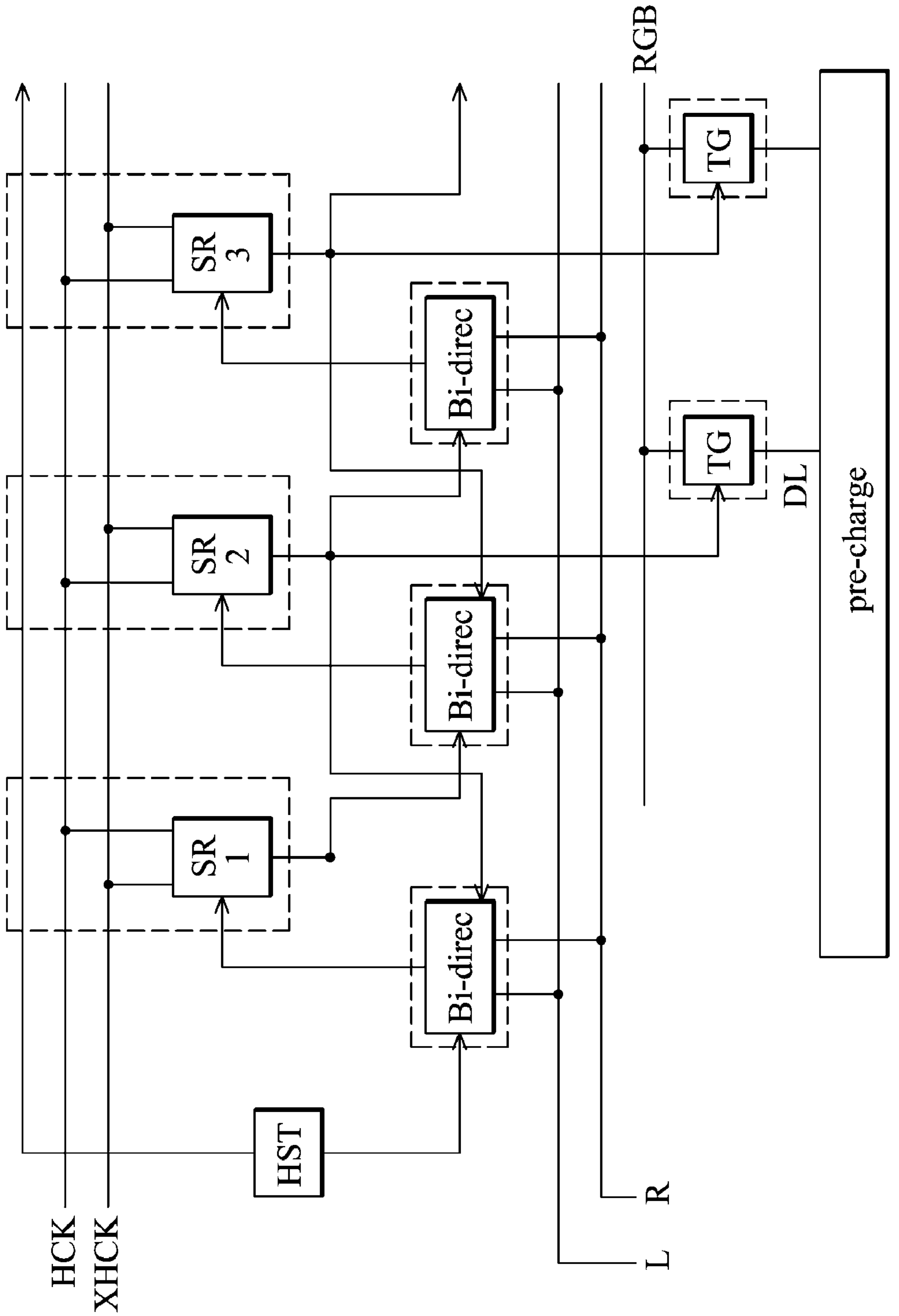
FIG. 3B ( PRIOR ART )
FIG. 3B is a block diagram of a conventional horizontal scan shift register with a pre-charge circuit.
Figure 4:
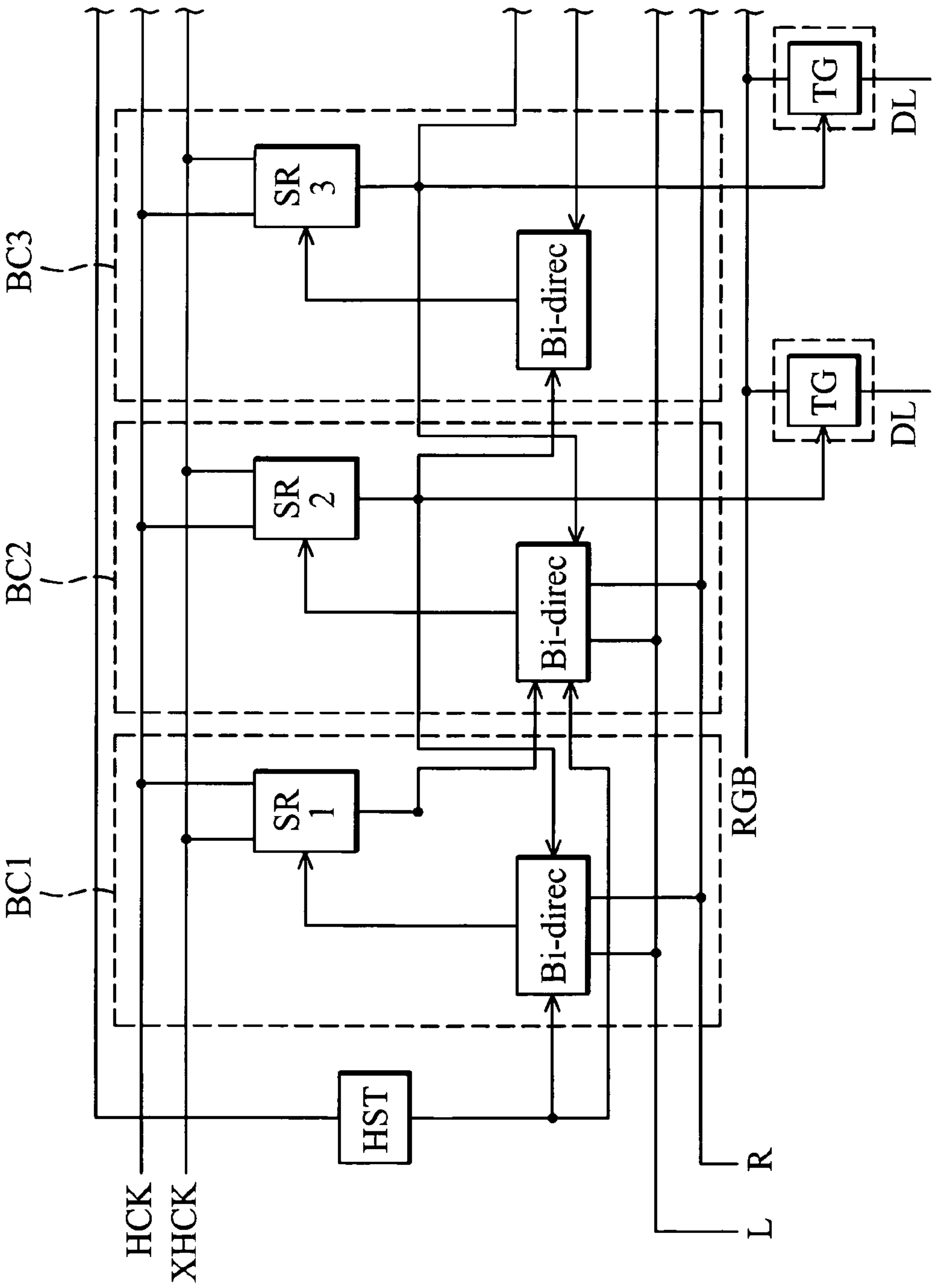
FIG. 4 shows a structure of a horizontal scan shift register according to one embodiment of the invention.

FIG. 4 shows a structure of a horizontal scan shift register according to an embodiment of the invention. The horizontal scan shift register comprises a plurality of scan shift register cell (shown as BC1 to BC3 in FIG. 4), a pair of complementary clock signal lines HCK/XHCK, and a horizontal start signal generator HST. Each scan shift register cell (shown as BC1 to BC3 in FIG. 4) comprises a bidirectional circuit Bi-direc, a shift register (shown as SR1 to SR3 in FIG. 4). The bidirectional circuit Bi-direc operates according to a direction control signal L/R. The shift register (shown as SR1 to SR3 in FIG. 4) is coupled to the bidirectional circuit Bi-direc. Each of the scan shift register cells after the first (shown as SR2 to SR3 in FIG. 4) further comprises a transmission gate TG and a data line DL. The transmission gate TG is coupled to the shift register (shown as SR2 to SR3 in FIG. 4) and receives an RGB signal. The data line DL is coupled to the transmission gate TG. The complementary clock signal lines HCK/XHCK are respectively coupled to the shift registers in the scan shift register cells (shown as BC1 to BC3 in FIG. 4). The horizontal start signal generator HST provides a horizontal start signal to the bidirectional circuits in the first scan shift register cell BC1 and a subsequent scan shift register cell (BC2 or BC3 in FIG. 4). The shift register (shown as SR1 to SR3 in FIG. 4) in each scan shift register cell (shown as BC1 to BC3 in FIG. 4) provides an output signal to the bidirectional circuit Bi-direc in the next scan shift register cell (BC2 or BC3 in FIG. 4). The bidirectional circuit Bi-direc in each scan shift register cell (shown as BC1 to BC3 in FIG. 4) also receives the output signal from the shift register (shown as SR2 to SR3 in FIG. 4) in the next scan shift register cell (BC2 or BC3 in FIG. 4). Preferably, the subsequent scan shift register cell is the second scan shift register cell BC2.

Figure 5:
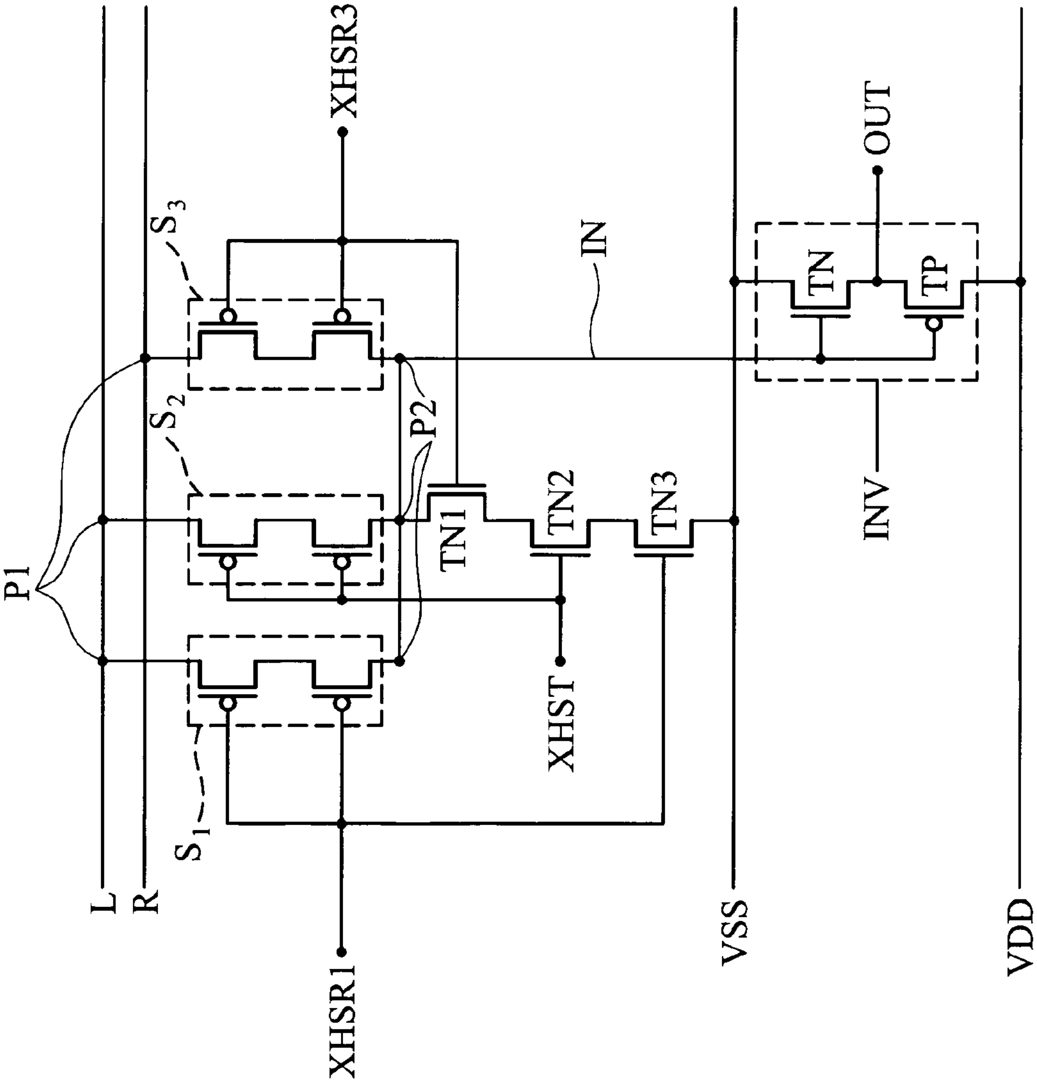
FIG. 5 is a circuit diagram of the bidirectional circuit in a scan shift register cell according to one embodiment of the invention.

A circuit diagram of the bidirectional circuit Bi-direc in the subsequent scan shift register cell is shown in FIG. 5. The bidirectional circuit Bi-direc comprises first, second and third PMOS transistor series $S_1$ to $S_3$, a first NMOS transistor TN1, a second NMOS transistor TN2, a third NMOS transistor TN3 and an inverter INV. Each of the first, second and third PMOS transistor series $S_1$ to $S_3$ comprises two common-gated PMOS transistors connected in series. First terminals P1 of the first PMOS transistor series $S_1$ and second PMOS transistor series $S_2$ receive a left direction control signal L. A first terminal P1 of the third PMOS transistor series $S_3$ receives a right direction control signal R. A common gate of the first PMOS transistor series $S_1$ receives an output signal XHSR1 from the shift register SR1 in the previous scan shift register cell. A common gate of the second PMOS transistor series $S_2$ receives the horizontal start signal XHST. A common gate of the third PMOS transistor series $S_3$ receives an output signal XHSR3 from the shift register SR3 in the next scan shift register cell. Second terminals P2 of the first, second and third PMOS transistor series $S_1$ to $S_3$ are interconnected. A drain of the first NMOS transistor TN1 is connected to the second terminals P2 of the first, second and third PMOS transistor series $S_1$ to $S_3$. A gate of the first NMOS transistor TN1 is connected to the common gate of the third PMOS transistor series $S_3$. A drain and gate of the second NMOS transistor TN2 are respectively connected to a source of the first NMOS transistor TN1 and the common gate of the second PMOS transistor series $S_2$. A drain of the third NMOS transistor TN3 is connected to a source of the second NMOS transistor TN2. A gate and source of the third NMOS transistor TN3 are respectively connected to the common gate of the first PMOS transistor series $S_1$ and a first DC voltage. The inverter INV comprises an input terminal IN and an output terminal OUT. The input terminal IN is connected to second terminals P2 of the PMOS transistor series. Preferably, the first DC voltage is Vss.

Furthermore, the inverter INV further comprises an NMOS transistor TN and a PMOS transistor TP. A source of the NMOS transistor TN is connected to the first DC voltage. A gate and drain of the NMOS transistor TN are respectively connected to the input terminal IN and the output terminal OUT of the inverter INV. A source of the PMOS transistor TP is connected to a second DC voltage. A gate and drain of the PMOS transistor TP are respectively connected to the input terminal IN and the output terminal OUT of the inverter INV. Preferably, the second DC voltage is VDD.

Figure 6:
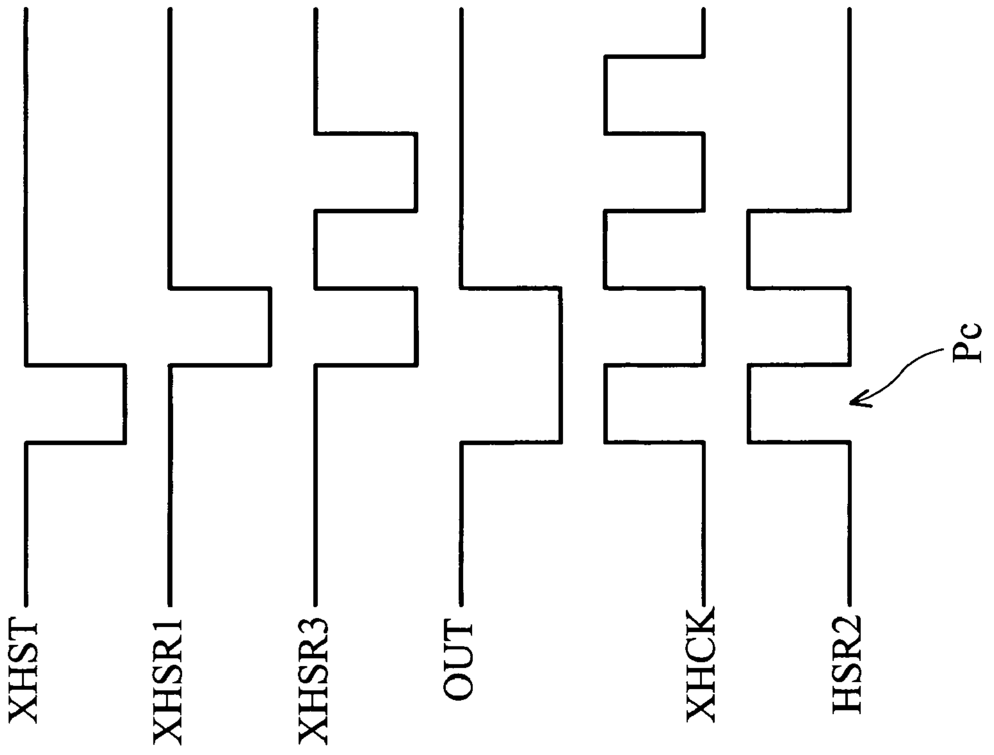
FIG. 6 shows waveforms of all required signals when the horizontal start signal is transmitted to the second scan shift register cell.

FIG. 6 shows waveforms of all required signals when the horizontal start signal XHST is transmitted to the second scan shift register cell BC2. The horizontal start signal XHST, the output signal XHSR1 generated by the shift register SR1 in the first scan shift register cell BC1, and the output signal XHSR3 generated by the shift register SR3 in the third scan shift register cell BC3 are transmitted to the second scan shift register cell BC2 such that an output pulse width of the bidirectional circuit becomes twice that of the original. Thus, from the second scan shift register cell BC2 on, each scan shift register cell generates a double-pulse scan signal. The first pulse is a pre-charge pulse Pc. The second pulse is utilized store actual RGB signal in a storage capacitor.

According to one embodiment of the invention, a method for driving a flat panel display comprises doubling a pulse width of an output pulse of a bidirectional circuit and generating a double-pulse scan signal according to the output pulse of the bidirectional circuit.

A 3-input NAND gate is utilized to implement a bidirectional circuit. The bidirectional circuit is capable of receiving a single-width pulse and generating a double-width pulse having an pulse width twice that of the single-width pulse. The shift register in each scan shift register cell converts the double-width pulse into a double-pulse scan signal comprised of two pulses. The first pulse of the double-pulse scan signal enables pre-charge, and the second pulse of the double-pulse scan signal enables input of an actual pixel voltage. As such, the invention requires no additional pre-charge circuit block and driving signal lines. It is permissible to use only three additional thin film transistors to implement the invention.

While the invention has been described by way of example and in terms of preferred embodiment, it is to be understood that the invention is not limited thereto. Rather, it is intended to cover various modifications and would be apparent to those skilled in the art. Therefore, the scope of the appended claims should be accorded the broadest interpretation so as to encompass all such modifications.

What is claimed is:

1. A driving circuit for use in a flat panel display, comprising:

a plurality of scan shift register cells, each having
- a bidirectional circuit controlled by a direction control signal, and
- a shift register coupled to the bidirectional circuit,
- wherein at least one of the scan shift register cells comprises
  - a transmission gate coupled to the shift register and adapted to receive an RGB signal, and
  - a data line coupled to the transmission gate;

a pair of complementary clock signal lines coupled to the shift registers in the scan shift register cells correspondingly; and a horizontal start signal generator adapted to provide a horizontal start signal simultaneously to the bidirectional circuits in a first and a second scan shift register cells, in which the second shift register cell is next to the first shift register cell;

wherein the shift register in each scan shift register cell is adapted to provide an output signal to the bidirectional circuit in the next scan shift register cell, and the bidirectional circuit in each scan shift register cell is adapted to receive the output signal from the shift register in the next scan shift register cell.

2. The driving circuit of claim 1, wherein the bidirectional circuit in the second scan shift register cell comprises:

first, second and third PMOS transistor series, each comprising two common-gated PMOS transistors connected in series, wherein first terminals of the first PMOS transistor series and second PMOS transistor series are adapted to receive a left direction control signal, a first terminal of the third PMOS transistor series is adapted to receive a right direction control signal, a common gate of the first PMOS transistor series is adapted to receive an output signal from the shift register in the previous scan shift register cell, a common gate of the second PMOS transistor series is adapted to receive the horizontal start signal, a common gate of the third PMOS transistor series is adapted to receive an output signal from the shift register in the next scan shift register cell, and second terminals of the first, second and third PMOS transistor series are interconnected;

a first NMOS transistor having a drain connected to the second terminals of the first, second and third PMOS transistor series, and a gate connected to the common gate of the third PMOS transistor series;

a second NMOS transistor having a drain and a gate connected to a source of the first NMOS transistor and the common gate of the second PMOS transistor series, respectively;

a third NMOS transistor having a drain connected to a source of the second NMOS transistor, and a gate and a source connected to the common gate of the first PMOS transistor series and a first DC voltage, respectively; and an inverter, connected to second terminals of the PMOS transistor series, having an input terminal and an output terminal.

3. The driving circuit of claim 2, wherein the first DC voltage is VSS.

4. The driving circuit of claim 2, wherein the inverter comprises:

an NMOS transistor having a source connected to the first DC voltage, a gate connected to the input terminal, and a drain connected to the output terminal of the inverter; and a PMOS transistor having a source connected to a second DC voltage, a gate connected to the input terminal, and a drain connected to the output terminal of the inverter.

5. The driving circuit of claim 4, wherein the second DC voltage is VDD.

6. A liquid crystal display comprising the driving circuit of claim 1.

7. A method for driving a flat panel display using the driving circuit of claim 1, comprising:

providing a horizontal start signal and an output signal of a first shift register in a scan shift register cell to a bidirectional circuit of a next scan shift register cell;

generating an output pulse with double width of the horizontal start signal by the bidirectional circuit; and providing the output pulse of the bidirectional circuit to a shift register of the next scan shift register cell;

generating a scan signal according to the output pulse of the bidirectional circuit by the shift register, wherein the scan signal has two pulses.

8. A method of claim 7, a first pulse of the scan signal is a pre-charge pulse.

* * * * *